United States Patent [19]
Nakai et al.

[11] Patent Number: 5,426,058
[45] Date of Patent: Jun. 20, 1995

[54] METHOD OF MANUFACTURING SOLID-STATE IMAGING DEVICE

[75] Inventors: Junichi Nakai; Shouichi Ishibe; Tsuyoshi Itoo, all of Fukuyama; Toshihiko Degawa, Yamatokoriyama, all of Japan

[73] Assignee: Sharp Kabushiki Kaisha, Osaka, Japan

[21] Appl. No.: 230,890

[22] Filed: Apr. 20, 1994

Related U.S. Application Data

[63] Continuation of Ser. No. 728,881, Jul. 12, 1991, abandoned.

[51] Int. Cl.6 .................... H01L 21/304; H01L 27/14
[52] U.S. Cl. ........................ 437/2; 437/226; 437/229; 437/231
[58] Field of Search .............. 437/2, 225, 226, 229, 437/231

[56] References Cited

U.S. PATENT DOCUMENTS

| | | | |
|---|---|---|---|
| 3,846,905 | 11/1974 | Harper | 437/188 |
| 4,081,277 | 3/1978 | Brault et al. | 437/2 |
| 4,553,153 | 11/1985 | McColgin et al. | |
| 4,806,504 | 2/1989 | Cleeves | 437/231 |
| 4,827,118 | 5/1989 | Shibata et al. | |
| 4,983,546 | 1/1991 | Hyun et al. | 437/231 |
| 4,997,793 | 3/1991 | McClurg | 437/227 |
| 5,077,234 | 12/1991 | Scoopo et al. | 437/231 |
| 5,118,924 | 6/1992 | Mehra et al. | 437/229 |
| 5,135,891 | 8/1992 | Ikeno et al. | 437/229 |
| 5,155,060 | 10/1992 | Ikeno et al. | 437/231 |
| 5,157,001 | 10/1992 | Sakuma | 437/227 |

FOREIGN PATENT DOCUMENTS

| | | |
|---|---|---|
| 0124025A2 | 11/1984 | European Pat. Off. |
| 61-199659 | 9/1986 | Japan |
| 61-203663 | 9/1986 | Japan |
| 64-10666 | 1/1989 | Japan |
| 1-270362 | 10/1989 | Japan |

*Primary Examiner*—Mary Wilczewski
*Attorney, Agent, or Firm*—David G. Conlin; George W. Neuner; Brian Michaelis

[57] ABSTRACT

The production of a solid-state imaging device includes the steps of: smoothing the surface of a semiconductor substrate by embedding a polymeric or polymerizable material into recessed portions in the surface of the substrate on which a plurality of solid-state imaging devices are formed, forming optical component parts on the substrate, and cutting the substrate along scribe lines that constitute part of the recessed portions.

25 Claims, 3 Drawing Sheets

METHOD OF MANUFACTURING SOLID-STATE IMAGING DEVICE

This is a continuation of application Ser. No. 07/728,881 filed on Jul. 12, 1991, now abandoned.

BACKGROUND OF THE INVENTION

1. Field of the Invention

The present invention relates to a solid-state imaging device used in video cameras or the like and having optical component parts such as color filters, microlenses, etc. directly formed on a semiconductor substrate, and to a method of manufacturing the same.

2. Description of the Prior Art

In recent years, there has been an increasing need for reduction in size and enhancement of performance in the field of video cameras and other apparatus, and to meet such needs, efforts have been directed to the development of further miniaturized, higher sensitivity solid-state imaging devices which are used in such apparatus. For miniaturization and enhanced sensitivity of a solid-state imaging device, optical component parts such as color filters and microlenses are formed directly on a semiconductor substrate on which the solid-state imaging device is formed.

Formation of such optical component parts, for example, microlenses, is accomplished in the following manner. First, a transparent, non-dyeable material such as acrylic resin, epoxy resin, polyimide resin, etc. is applied by spincoating on a semiconductor substrate with a plurality of solid-state imaging devices formed thereon, thereby smoothing the surface of the semiconductor.

Thereafter, a dyeable resist for forming filters, such as gelatine, casein, etc. is applied also by spincoating, exposed to light, and developed to form a dyeable resist pattern on the pixel regions. Next, the resist pattern is dyed with a dyestuff having a desired spectral characteristic to obtain a color filter pattern. The process is repeated several times to form on-chip color filters.

On the substrate processed in this way, the same material as used for smoothing the substrate surface is applied, also by spincoating, to form a flat protective film, and on top of the protective film are formed microlenses, one for each pixel, using a known technique such as disclosed in Japanese Laid-Open Patent Publication No. 64-10666. The on-chip microlenses are thus formed.

According to the above method, the non-dyeable material for smoothing the surface, the dyeable resist for forming color filters, and the resist for forming microlenses are applied on the substrate using the spincoating technique. However, since the substrate surface is uneven because of scribe lines, metal wiring, etc. formed therein, films applied by spincoating on the substrate tend to become uneven in thickness because of the irregularities on the substrate surface. For example, FIG. 5 shows a case in which a color filter resist film 33 formed on a substrate 31 has an uneven thickness over the same pixel region. This appears as a thickness variation 32 on the surface of the resist film 33, as shown in FIG. 6. That is, a striation appears. FIG. 5 is a cross section taken along line A—A' in FIG. 6.

When color filters are formed by dyeing such a resist film, the resulting problem is that imaging and sensitivity variations occur and thus the picture quality is substantially degraded, because of the thickness variations of the filter layer portions corresponding to the respective pixels.

In order to enhance the light gathering efficiency of the microlens, it is essential that the thickness of the protective film below the microlens and the thickness of the microlens resist film be maintained uniform. However, because of the irregularities on the substrate surface, as mentioned above, it has been difficult to maintain the thicknesses of the two films uniform. Since the uneven thickness of the microlens resist film leads to uneven spacing between adjacent microlenses and variation in the bottom area thereof, there occurs variation in the light gathering efficiency among the microlenses, which causes sensitivity variations leading to degradation of the picture quality.

SUMMARY OF THE INVENTION

The method of manufacturing a solid-state imaging device of this invention, which overcomes the above-discussed and numerous other disadvantages and deficiencies of the prior art, comprises the steps of: smoothing the surface of a semiconductor substrate by embedding a polymeric material into recessed portions in the surface of the substrate on which a plurality of solid-state imaging devices are formed; forming optical component parts on the substrate; and cutting the substrate along scribe lines that constitute part of the recessed portions.

In a preferred embodiment, the plurality of solid-state imaging devices are each formed in a pixel region and the recessed portions are formed in a peripheral region surrounding each pixel region.

In a prefered embodiment, the polymeric material is composed of a photosensitive resin.

In a preferred embodiment, the polymeric material is composed of a thermosoftening material containing a thermosetting agent and the thermosoftening material is heated to a temperature higher than its setting temperature after being softened by heating to a temperature lower than its setting temperature.

In a preferred embodiment, the polymeric material is composed of a thermosoftening material containing a photo-curing agent and the thermosoftening material is first softened by heating and then cured by radiation of light.

In a preferred embodiment, the optical component parts are color filters.

In a preferred embodiment, the optical component parts are microlenses.

In a preferred embodiment, the step of embedding of the polymeric material into the recessed portions is performed one or more times during the surface smoothing step.

In a preferred embodiment, a different mask pattern is used for each embedding of the polymeric material.

According to another aspect of the present invention, there is provided a solid-state imaging device manufactured by smoothing the surface of a semiconductor substrate by embedding a polymeric materail into recessed portions in the surface of the substrate on which a plurality of solid-state imaging devices are formed, forming optical component parts on the substrate, and thereafter cutting the substrate along scribe lines that constitute part of the recessed portions.

Thus, the invention described herein makes possible the objectives: (1) providing a method of manufacturing a solid-state imaging device in which the surface of the substrate can be smoothed, prior to application of spincoating, by embedding the polymeric material into the recessed portions, and since films necessary for forming optical component parts are formed on the substrate surface using the spincoating technique, the films can be deposited in uniform thickness; and (2) providing a solid-state imaging device with smooth substrate surface and films of uniform thickness which are required for forming optical component parts.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The preferred embodiments of the invention will now be described with reference to the accompanying drawings.

Figure 1:
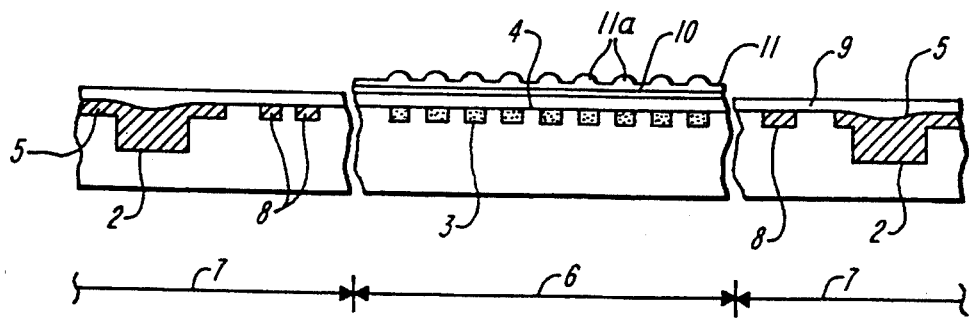
FIG. 1 is a cross sectional view of a solid-state imaging device in one embodiment of the present invention.

FIG. 1 is a cross sectional view of a solid-state imaging device in one embodiment of the present invention. The solid-state imaging device comprises a pixel region 6 (actually, a plurality of such regions are formed on a semiconductor substrate 1 but only one such region is shown here) in which there are formed a plurality of light receiving parts 3 formed from photodiodes or the like and a plurality of transferring parts 4 formed from CCDs or the like for sequentially transferring signals photoelectric-converted by the light receiving parts 3, the pixel region 6 being surrounded by a peripheral region 7. In the peripheral region 7 there are formed recessed portions 2 that represent scribe lines and a field portion containing recessed portions 8 that are made by metal wiring, etc. The recessed portions 2 representing the scribe lines are provided to separate the pixel regions 6.

A negative type transparent resin (brand name FVR-10, manufactured by Fuji Pharmaceutical Co.) is embedded into the recessed portions 2 and 8 to provide a flat and flush surface, and a flat film 9 formed from the photosensitive resin is deposited covering the peripheral region 7 and the pixel region 6. On top of the flat film 9 and above the pixel region 6, an on-chip color filter 10 and an on-chip microlens 11 are successively formed in this order. The on-chip color filter 10 is constructed, for example, with three color filter layers formed for each pixel. One of the layers is a red color filter layer, one is a green color filter layer, the other is a blue color filter layer. The on-chip microlens 11 is formed from a transparent resin or the like, using, for example, the previously mentioned known method, the on-chip microlens 11 having convex lens portions one each disposed above each light receiving part 3.

We will now describe a method of manufacturing a solid-state imaging device of the above construction.

Figure 2A:
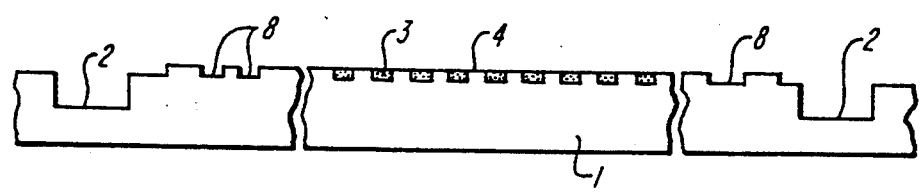
FIGS. 2(a), 2(b), and 2(c) are cross sectional views illustrating the manufacturing steps for the solid-state imaging device shown in FIG. 1.
Figure 2B:
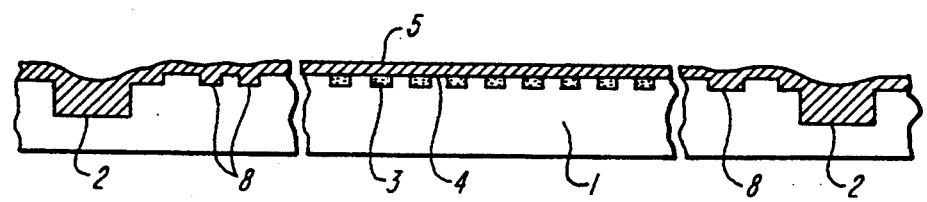

First, as shown in FIG. 2(a), a semiconductor substrate 1 is readied having light receiving parts 3 and transferring parts 4 formed in each pixel region 6 and recessed portions 2 and 8 formed in each peripheral region 7, or a semiconductor substrate 1 having such configuration is fabricated. Next, as shown in FIG. 2(b), the above-mentioned photosensitive resin 5 is applied by spincoating over the entire surface of the semiconductor substrate 1. The coating is applied so that the thickness of the photosensitive resin 5 is controlled to, for example, 1.0 μm at the portions of the substrate 1 where the recessed portions 2, 8 such as scribe lines or metal wiring are not formed.

Figure 2C:
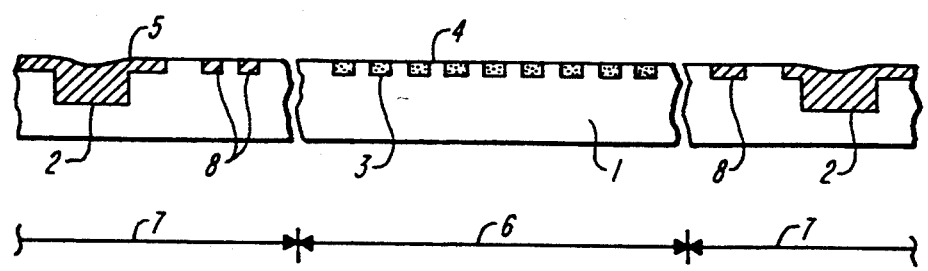

The coating is allowed to dry and is then selectively exposed to ultraviolet radiation through a mask (not shown), exposing only the portions above the recessed portions 2 and 8 in the peripheral region 7, so that the exposed portions harden. Next, the unhardened portions of the photosensitive resin 5 are removed using a prescribed developer and a rinsing solvent, to obtain the semiconductor substrate 1 having the surface of the peripheral region 7 smoothed as shown in FIG. 2(c).

After drying the semiconductor substrate 1, the same photosensitive resin 5 as previously used is applied by spincoating over the entire surface of the substrate 1, to form a flat film 9. At this time, since the peripheral region 7 has a flat and flush surface as described above, the flat film 9 applied by spincoating is formed in uniform thickness free from variations of coating.

Thereafter, using a known technique, an on-chip color filter 10 and an on-chip microlens 11 are successively formed in this order on top of the pixel region 6. To form the on-chip color filter 10, a dyeable resist for forming a color filter is first applied by spincoating and is then exposed and developed to form a resist pattern, and a processing step for dyeing the resist pattern with a prescribed dyestuff is repeated several times. The on-chip microlens 11 is formed using a known technique (such as disclosed in Japanese Laid-Open Patent Publication No. 64-10666) after forming a protective film over the on-chip color filter 10 as required.

The on-chip color filter 10 has a uniform thickness free from thickness variation since the flat film 9 formed below it has a flat surface. For the same reason, the resist film deposited thereon to form the on-chip microlens 11 has a uniform thickness, and therefore, the lens portions 11a disposed above the light receiving parts 3 are formed equally spaced apart from each other and each having the same bottom area, thus ensuring no variation in the light gathering efficiency among them.

The substrate 1 formed in this way is cut into chips along the recessed portions 2 that represent the scribe lines, thus manufacturing individual solid-state imaging devices.

Therefore, in the solid-state imaging device of the present invention, the thickness of the on-chip color filter 10 is uniform and there is no variation in the light gathering efficiency of the on-chip microlens 11, which ensures enhanced picture quality.

The step of smoothing the surface by embedding the photosensitive resin 5 may be repeated two or more times if necessary. In this case, the mask pattern and the thickness of resin may be changed each time the smoothing step is performed, depending on the surface flatness achieved by the preceding smoothing step.

The above embodiment has dealt with a case in which the on-chip microlens 11 is formed on top of the on-chip color filter 10, but it will be appreciated that the invention can also be applied to a case in which only the on-chip color filter or only the on-chip microlens is formed on the substrate 1 and also to a case in which other optical component parts are formed on the substrate 1.

The photosensitive resin 5 is not restricted to the one used in the above embodiment, but other polymeric materials composed mainly of acrylic resin, epoxy resin, polyimide resin, isocyanate resin, etc. are also suitable for the present purpose. Also, a polymeric resin having thermosetting properties such as phenol resin and epoxy resin, or a polymeric material composed of a thermosoftening resin such as polystyrene resin and polypropylene resin containing a thermosetting agent such as imide and epoxide, or a photo-curing agent such as azide and acrylate, may be used for the purpose of further enhancing the surface flatness.

Figure 3A:
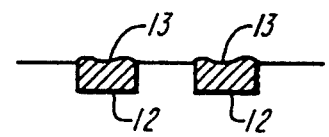
FIG. 3(a) is a diagram showing a polymeric material simply embedded into recessed portions.
Figure 3B:
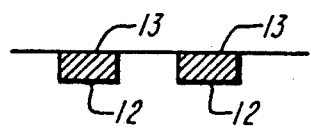
FIG. 3(b) is a diagram showing the embedded polymeric material after being softened.

FIG. 3 is a diagram explaining an advantage when a polymeric material composed of a thermosoftening material containing a thermosetting agent is used. As shown in FIG. 3(a), when the polymeric material 13 is simply embedded into recessed portions 12 that represent scribe lines, etc., the surface of the embedded polymeric material 13 is more or less rugged. The advantage of using the polymeric material composed of a thermosoftening resin containing a thermosetting agent is that, by heating the material to a temperature higher than its setting temperature after maintaining it at a temperature lower than the setting temperature, the polymeric material 13 softens and then turns from the state shown in FIG. 3(a) to the state shown in FIG. 3(b), thereby enhancing the surface flatness.

Figure 4A:
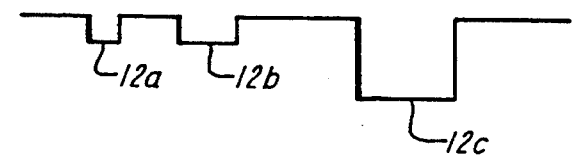
FIG. 4(a) is a diagram showing recessed portions of different sizes formed with different pitches.
Figure 4B:
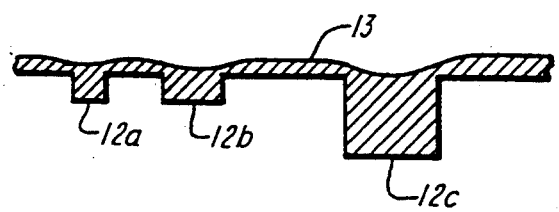
FIG. 4(b) is a diagram showing the recessed portions with the polymeric material applied thereon.
Figure 4C:
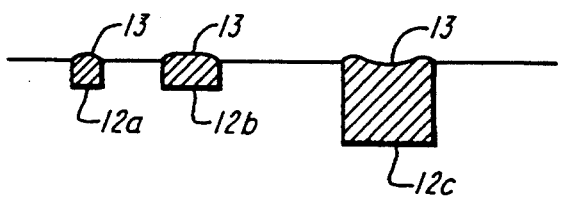
FIG. 4(c) is a diagram showing the recessed portions after development.
Figure 4D:
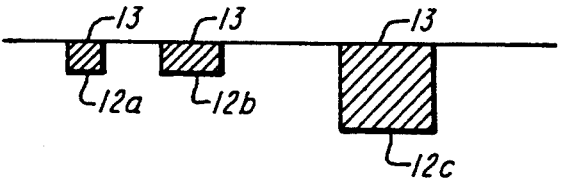
FIG. 4(d) is a diagram showing the recessed portions after softening of the polymeric material.
Figure 5:
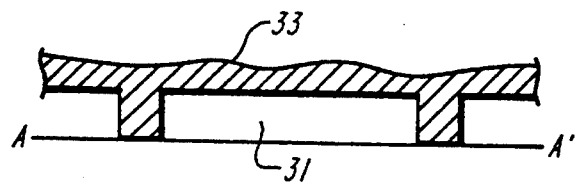
FIG. 5 is a cross sectional view of a prior art solid-state imaging device with a resist film formed on a substrate.
Figure 6:
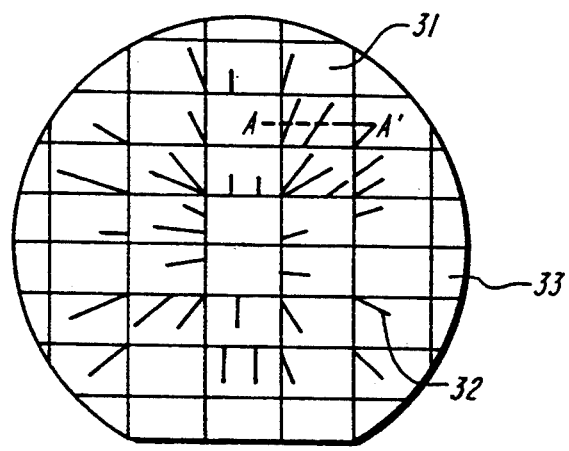
FIG. 6 is a top plan view showing the surface of the resist film.

A further advantage is that the surface flatness can be enhanced also when the material is applied to recessed portions 12a, 12b, and 12c formed in different sizes and with different pitches, as shown in FIG. 4(a). When unwanted portions are removed after applying the polymeric material 13 as shown in FIG. 4(b), the surfaces of the portions of the polymeric material 13 left in the recessed portions 12a, 12b, and 12c are more or less rugged as shown in FIG. 4(c), but by softening the material by heating, the surfaces of the material left in the recessed portions 12a, 12b, and 12c can be made flat in a single process under the same condition, as shown in FIG. 4(d), without requiring processing under different conditions according to the different sizes and pitches. The material used need not necessarily be in a polymeric state when applied for coating, but the material such as polyimide, that turns into a polymer when set by heating or by radiation of light, i.e. cross-linking, may be used for the purpose.

The advantages described with reference to FIGS. 3 and 4 are also offered when a polymeric material composed of a thermosoftening resin containing a photo-curing agent is used. In this case the thermosoftening material is softened by heating and is then cured by radiation of light.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of manufacturing a solid-state imaging device having a smooth continuous semi-conductor substrate surface on which a plurality of solid-state imaging devices are formed, the method comprising the steps of:

smoothing the surface of a semiconductor substrate by applying a polymeric material comprising a thermosoftening material into recessed portions of said semiconductor substrate and then heating said polymeric material to soften and smoothen said polymeric material;

curing said polymeric material in said recessed portions following said smoothing step;

applying another polymeric material to an entire surface of said substrate to form a uniformly smooth continuous semiconductor substrate surface;

forming optical component part on said another polymeric material; and cutting the substrate along scribe lines that constitute part of the recessed portions.

2. A method of manufacturing a solid-state imaging device as set forth in claim 1, wherein:

the plurality of solid-state imaging devices are each formed in a pixel region and the recessed portions are formed in a peripheral region surrounding each pixel region.

3. A method of manufacturing a solid-state imaging device as set forth in claim 1, wherein:

the polymeric material is composed of a thermosoftening material containing a thermosetting agent and the thermosoftening material is heated to a temperature higher than its setting temperature after being softened by heating to a temperature lower than its setting temperature.

4. A method of manufacturing a solid-state imaging device as set forth in claim 1, wherein:

the polymeric material is composed of a thermosoftening material containing a photo-curing agent and the thermosoftening material is first softened by heating and then cured by radiation of light.

5. A method of manufacturing a solid-state imaging device as set forth in claim 1, wherein:

the optical component parts are color filters formed in a single continuous uniform layer directly on said smooth continuous semiconductor substrate surface.

6. A method of manufacturing a solid-state imaging device as set forth in claim 1, wherein:

the optical component parts are microlenses formed in a single layer directly on said smooth continuous semiconductor substrate surface.

7. A method of manufacturing a solid-state imaging device as set forth in claim 1, wherein:

the step of applying of the polymeric material into the recessed portions is performed one or more times before applying said another polymeric material to an entire surface to form a uniformly smooth continuous semiconductor substrate surface.

8. A method of manufacturing a solid-state imaging device as set forth in claim 7, wherein:
a different mask pattern is used to irradiate the polymeric material in recessed portions in repeated applications of polymeric material to said recessed portions.

9. A method of manufacturing a solid-state imaging device having a smooth surface semiconductor substrate on which a plurality of solid-state imaging devices are formed, the method comprising the steps of:
preparing a semiconductor substrate having light receiving parts and charge transferring parts in pixel regions and recessed portions in regions peripheral to and surrounding said pixel regions;
applying a first polymeric material comprising a thermosoftening material into said recessed portions in a thickness sufficient to fill a depth of said recessed portions, and then heating said first polymeric material to soften and smoothen said first polymeric material;
curing said first polymeric material in said recessed portions following said heating step;
applying a second polymeric material to an entire surface of said semiconductor substrate to form a uniformly flat surface to said semiconductor substrate;
forming optical component parts on said uniformly flat surface; and
cutting said semiconductor substrate along scribe lines defined by said recessed portions of said peripheral regions.

10. The method of claim 9 wherein the step of forming optical component parts on the substrate includes applying an on-chip microlens in combination with an on-chip color filter to the semiconductor substrate surface.

11. The method of claim 9 wherein said first polymeric material is comprised of a thermosoftening material containing a thermosetting agent.

12. The method of claim 11 where in the step of applying said first polymeric material comprised of a thermosoftening material includes heating the thermosoftening material to a temperature higher than a setting temperature after said material is softened by heating to a temperature lower than said setting temperature.

13. The method of claim 9 wherein said thermosoftening material contains a photo-curing agent and is softened by heating and cured by radiation with light.

14. A method of manufacturing a solid-state imaging device, comprising the steps of:
embedding a thermosoftening polymeric or polymerizable material containing a thermosetting agent into recessed portions in the surface of a semiconductor substrate on which a plurality of solid-state imaging devices are formed;
softening the thermosoftening material embedded in the recessed portions by heating it to a temperature lower than the setting temperature of the thermosetting agent;
setting the thermosoftening material by heating it to a temperature higher than the setting temperature;
forming optical component parts on the substrate; and
cutting the substrate along scribe lines that constitute part of the recessed portions.

15. A method of manufacturing a solid-state imaging device as set forth in claim 14, wherein:
the plurality of solid-state imaging devices are each formed in a pixel region and the recessed portions are formed in a peripheral region surrounding each pixel region.

16. A method of manufacturing a solid-state imaging device as set forth in claim 14, wherein:
the optical component parts are color filters.

17. A method of manufacturing a solid-state imaging device as set forth in claim 14, wherein:
the optical component parts are microlenses.

18. A method of manufacturing a solid-state imaging device as set forth in claim 14, wherein:
embedding of the thermosoftening polymeric or polymerizable material into the recessed portions is performed one or more times.

19. A method of manufacturing a solid-state imaging device as set forth in claim 18, wherein:
a different mask pattern is used for each embedding of the thermosoftening polymeric or polymerizable material.

20. A method of manufacturing a solid-state imaging device, comprising the steps of:
embedding a thermosoftening polymeric or polymerizable material containing a photocuring agent into recessed portions in the surface of a semiconductor substrate on which a plurality of solid-state imaging devices are formed;
softening the thermosoftening material embedded in the recessed portions by heating;
curing the thermosoftening material by radiation of light;
forming optical component parts on the substrate; and
cutting the substrate along scribe lines that constitute part of the recessed portions.

21. A method of manufacturing a solid-state imaging device as set forth in claim 20, wherein:
the plurality of solid-state imaging devices are each formed in a pixel region and the recessed portions are formed in a peripheral region surrounding each pixel region.

22. A method of manufacturing a solid-state imaging device as set forth in claim 20, wherein:
the optical component parts are color filters.

23. A method of manufacturing a solid-state imaging device as set forth in claim 20, wherein:
the optical component parts are microlenses.

24. A method of manufacturing a solid-state imaging device as set forth in claim 20, wherein:
embedding of the thermosoftening polymeric or polymerizable material into the recessed portions is performed one or more times.

25. A method of manufacturing a solid-state imaging device as set forth in claim 24, wherein:
a different mask pattern is used for each embedding of the thermosoftening polymeric or polymerizable material.

* * * * *